US011530609B2

(12) United States Patent
Al-AbdulJabbar et al.

(10) Patent No.: US 11,530,609 B2
(45) Date of Patent: Dec. 20, 2022

(54) WELL PLACING USING BAYESIAN NETWORK EXPERT SYSTEM

(71) Applicant: SAUDI ARABIAN OIL COMPANY, Dhahran (SA)

(72) Inventors: Ahmad Mohammad Al-AbdulJabbar, Dammam (SA); Adel Ali Al-Qahtani, Al Khubar (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 71 days.

(21) Appl. No.: 17/223,648

(22) Filed: Apr. 6, 2021

(65) Prior Publication Data

US 2022/0316327 A1 Oct. 6, 2022

(51) Int. Cl.
*E21B 49/00* (2006.01)
*G06N 3/04* (2006.01)
*G01V 1/30* (2006.01)
*G06N 3/08* (2006.01)
*G06F 30/20* (2020.01)
(Continued)

(52) U.S. Cl.
CPC .............. *E21B 49/00* (2013.01); *G01V 1/306* (2013.01); *G06F 30/20* (2020.01); *G06N 3/0472* (2013.01); *G06N 3/08* (2013.01); *E21B 7/04* (2013.01); *E21B 2200/20* (2020.05); *G01V 11/00* (2013.01)

(58) Field of Classification Search
USPC .......................................................... 702/11
See application file for complete search history.

(56) References Cited

U.S. PATENT DOCUMENTS 7,963,327 B1 6/2011 Saleri et al.
2007/0226158 A1 9/2007 Woronow et al.
(Continued)

FOREIGN PATENT DOCUMENTS

AU 2010310816 B2 1/2016
CA 2725923 C 10/2014
(Continued)

OTHER PUBLICATIONS

International Search Report and Written Opinion of the International Searching Authority issued in corresponding International Application No. PCT/US2022/023680, dated Jul. 4, 2022 (13 pages).

*Primary Examiner* — Paul D Lee
(74) *Attorney, Agent, or Firm* — Osha Bergman Watanabe & Burton LLP

(57) ABSTRACT

A system for determining a well placement may include an analysis module. The analysis module, using a Bayesian Decision Network model, may perform a first assessment of data availability, saturation, fracture, and seismic data associated with a candidate area for drilling a first well, and may output a first probability that indicates a potential production level of the first well. The analysis module may perform a second assessment of offset, stress, thickness, and porosity data associated with a second, nearby well, and may output a second probability that indicates a potential production level of the first well if a lateral is placed in a layer and at a azimuth direction. The analysis module may perform a third assessment of tortuosity, washout, and porosity data, and a net-to-gross value associated with the first well and may output a third probability that indicates a completion type for the first well.

20 Claims, 11 Drawing Sheets

(51) Int. Cl.
*E21B 7/04* (2006.01)
*G01V 11/00* (2006.01)

(56) References Cited

U.S. PATENT DOCUMENTS

| | | | |
|---|---|---|---|
| 2010/0211423 | A1 | 8/2010 | Hehmeyer |
| 2011/0225111 | A1* | 9/2011 | Ringer .................. G06N 7/005 |
| | | | 706/14 |
| 2013/0231910 | A1 | 9/2013 | Kumar et al. |
| 2013/0238304 | A1 | 9/2013 | Glinsky |
| 2014/0124264 | A1 | 5/2014 | Al-Yami et al. |
| 2015/0161303 | A1 | 6/2015 | Lewandowski |
| 2016/0281497 | A1* | 9/2016 | Tilke ....................... E21B 47/00 |
| 2017/0364795 | A1 | 12/2017 | Anderson et al. |
| 2018/0210413 | A1* | 7/2018 | Frangos ............... G01V 11/002 |
| 2018/0356544 | A1 | 12/2018 | Estival et al. |
| 2020/0157887 | A1 | 5/2020 | Alonso et al. |
| 2020/0242286 | A1 | 7/2020 | Marchidan et al. |
| 2021/0148213 | A1* | 5/2021 | Madasu .................. E21B 44/00 |

FOREIGN PATENT DOCUMENTS

| | | |
|---|---|---|
| CN | 109063285 A | 12/2018 |
| CN | 111550186 A | 8/2020 |
| WO | 2020028302 A1 | 2/2020 |

\* cited by examiner

WELL PLACING USING BAYESIAN NETWORK EXPERT SYSTEM

BACKGROUND

In the petroleum industry, the placement of a well with respect to a reservoir often determines how prolific the well will be. In addition, the placement of a lateral wellbore facilitates the tapping into sweet spot zones inside the reservoir to increase the productivity of the well. Conventionally, well operators employ reservoir simulation and drilling technologies to maximize well production.

However, there is a need for a system that provides improvements over the conventional techniques of determining locations for wells in order to maximize the well production by utilizing an expert system that facilitates a more accurate mapping of the reservoir structure and an ability to reach new hydrocarbon-rich areas more precisely.

SUMMARY

This summary is provided to introduce concepts that are further described below in the detailed description. This summary is not intended to identify key or essential features of the claimed subject matter, nor is it intended to be used as an aid in limiting the scope of the claimed subject matter.

In general, in one aspect, embodiments disclosed herein relate to a system for automatic determining of a well placement and a well completion type. The system includes one or more hardware processors. The system includes an access module configured to access, from a database, geological and geophysical data associated with a candidate area for drilling a first well and with an area of a second, nearby well. The system includes an analysis module. The analysis module is configured to perform, using a Bayesian Decision Network (BDN) model, a first assessment of a data availability score value, saturation data, fracture data, and seismic data included in the geological and geophysical data associated with the candidate area for drilling the first well. The analysis module is configured to output, based on the first assessment, a first probability value that indicates a potential level of production of the first well if drilled in the candidate area. The analysis module is configured to perform, using the BDN model, a second assessment of an offset data score value, stress data, thickness data, and porosity data included in the geological and geophysical data associated with the second, nearby well. The analysis module is configured to output, based on the second assessment, a second probability value that indicates a potential level of production of the first well if a lateral wellbore is placed in a particular layer and at a particular azimuth direction in a reservoir associated with the candidate area. The analysis module is configured to perform, using the BDN model, a third assessment of tortuosity data, washout data, porosity data, and a net-to-gross value associated with the first well. The analysis module is configured to output, based on the third assessment, a third probability value that indicates the well completion type for the first well.

In general, in one aspect, embodiments disclosed herein relate to a method for automatic determining of a well placement and a well completion type. The method includes accessing, from a database and using one or more hardware processors, geological and geophysical data associated with a candidate area for drilling a first well and with an area of a second, nearby well. The method includes performing, using a Bayesian Decision Network (BDN) model and the one or more hardware processors, a first assessment of a data availability score value, saturation data, fracture data, and seismic data included in the geological and geophysical data associated with the candidate area for drilling the first well. The method includes outputting, based on the first assessment and using the one or more hardware processors, a first probability value that indicates a potential level of production of the first well if drilled in the candidate area. The method includes performing, using the BDN model and the one or more hardware processors, a second assessment of an offset data score value, stress data, thickness data, and porosity data included in the geological and geophysical data associated with the second, nearby well. The method includes outputting, based on the second assessment and using the one or more hardware processors, a second probability value that indicates a potential level of production of the first well if a lateral wellbore is placed in a particular layer and at a particular azimuth direction in a reservoir associated with the candidate area. The method includes performing, using the BDN model and the one or more hardware processors, a third assessment of tortuosity data, washout data, porosity data, and a net-to-gross value associated with the first well. The method includes outputting, based on the third assessment and using the one or more hardware processors, a third probability value that indicates the well completion type for the first well.

In general, in one aspect, embodiments disclosed herein relate to a non-transitory machine-readable storage medium. The non-transitory machine-readable storage medium includes instructions that, when executed by one or more processors of a machine, cause the machine to perform operations. The operations may include accessing, from a database, geological and geophysical data associated with a candidate area for drilling a first well and with an area of a second, nearby well. The operations may include performing, using a Bayesian Decision Network (BDN) model, a first assessment of a data availability score value, saturation data, fracture data, and seismic data included in the geological and geophysical data associated with the candidate area for drilling the first well. The operations may include outputting, based on the first assessment, a first probability value that indicates a potential level of production of the first well if drilled in the candidate area. The operations may include performing, using the BDN model, a second assessment of an offset data score value, stress data, thickness data, and porosity data included in the geological and geophysical data associated with the second, nearby well. The operations may include outputting, based on the second assessment, a second probability value that indicates a potential level of production of the first well if a lateral wellbore is placed in a particular layer and at a particular azimuth direction in a reservoir associated with the candidate area. The operations may include performing, using the BDN model, a third assessment of tortuosity data, washout data, porosity data, and a net-to-gross value associated with the first well. The operations may include outputting, based on the third assessment, a third probability value that indicates the well completion type for the first well.

Other aspects and advantages of the claimed subject matter will be apparent from the following description and the appended claims.

BRIEF DESCRIPTION OF DRAWINGS

Some embodiments are illustrated by way of example and not limitation in the figures of the accompanying drawings.

DETAILED DESCRIPTION

Figure 1:
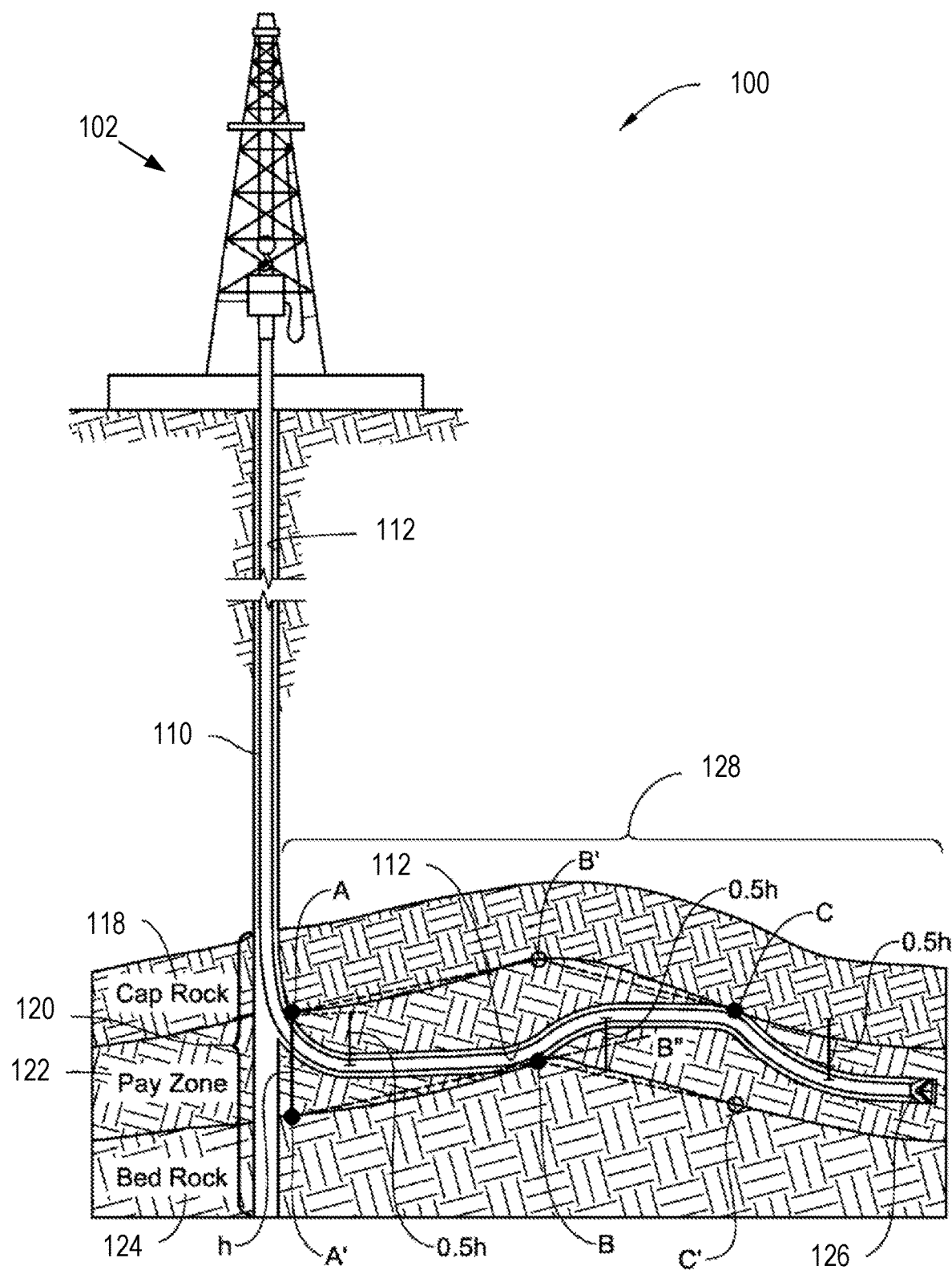
FIG. 1 illustrates a system, according to one or more example embodiments.

Example systems and methods for selecting a location for a well using an expert system are described. Unless explicitly stated otherwise, components and functions are optional and may be combined or subdivided. Similarly, operations may be combined or subdivided, and their sequence may vary.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, or third) may be used as an adjective for an element (that is, any noun in the application). The use of ordinal numbers is not to imply or create any particular ordering of the elements nor to limit any element to being only a single element unless expressly disclosed, such as using the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

According to some example embodiments, an expert system, such as a Bayesian Decision Network (BDN) expert system (hereinafter also an "expert system utilizing a BDN model" or a "system"), is utilized to determine how productive a new hydrocarbon well (hereinafter also "well") would be based on analysis of geological and geophysical data associated with a candidate drilling area and with an existing, nearby well, as well as geo-mechanics and drilling performance data associated with an actual well drilled in the candidate drilling area. The BDN expert system provides improvements over the existing methods by incorporating a probabilistic approach from historical data, and by combining offset well (e.g., nearby well) data, including drilling data and production data, with the various types of data available for the candidate drilling area to enable decision making that is more efficient and more accurate. For example, if a new well is planned to be drilled in area A, layer 1, and azimuth X, then offset well data is used to determine whether the new planned well has a potential of being placed successfully or not.

The current methods utilize offset data to draw conclusions with respect to how a new well would perform if it were drilled in a particular area. These conclusions could lack nuance and simply provide a binary result (e.g., "the new well will be productive" or "the new well will not be productive") that is not based on multiple types of. To avoid a binary result, the BDN expert system uses a probabilistic approach to generate a score between 0.0 and 1.0 that provides a more nuanced indication of how productive a new well would be if it were drilled in a candidate area. To this end, the BDN expert system uses multiple parameters and conditions to recommend an output in the format of a probability value (e.g., a number between 0.0 and 1.0). For example, based on an initial assessment of geological and geophysical data associated with a candidate area for drilling a new well, the BDN expert system determines that the probability that the new well would be productive is 0.87 (e.g., 87% chance of success). However, based on additional data from offset wells and actual drilling data from the candidate area, additional probability values may be generated to provide a more accurate determination of whether a productive new well could be drilled and completed in the candidate area.

In addition, the current simulation methods are not updated frequently because many of them require large amounts of resources and time to execute. Also, the current simulation software does not combine reservoir data, geo-mechanical data, production data, and completion data in one platform. In contrast, the BDN expert system may utilize updated inputs of various types of data, at various stages in the process, to re-evaluate whether the drilling of the new well in the candidate area is justified, whether the placement of a lateral wellbore in a particular layer and a particular azimuth direction continues to be the optimum decision, or whether the selection of a particular completion type should be recommended.

The BDN expert system may use a BDN model to score a potential production level of a well using a well placement workflow. In some example embodiments, the well placement workflow utilizes a set of criteria derived from historical data and field performance data to generate probabilistic matrices that are input into the BDN model to score the potential production of the well. A well potential score value is utilized, in some example embodiments, to determine a type of well completion that is appropriate for the well. The BDN model may utilize a probability matrix to combine the scores or values of multiple parameters to produce a final probability score. The scores of the multiple parameters may be generated, by the BDN model, using sub-matrices during a plurality of assessments.

A variety of data is utilized by the BDN model to generate highly accurate well production score values that serve as basis for determining whether to drill a well in a certain candidate area, whether to complete a well, or whether to redirect a well by drilling additional lateral wellbores (hereinafter also "laterals"). For instance, because the placement of lateral wellbores inside a reservoir is a common step toward achieving a prolific well, data associated with wells located in the vicinity of a candidate drilling location (hereinafter also "offset well data") is used in the BDN model to identify the best direction and layer for wellbore placement.

One of the benefits of using the BDN model is the use of a plurality of assessments of a range of data associated with a candidate drilling area and with existing nearby wells, such as geological, geophysical, geo-mechanical, and drilling performance data, to generate a plurality of scores that indicate the potential level of production of a well if a well is drilled in the candidate area, a lateral wellbore is placed in a particular layer and at a particular azimuth direction, and a well completion of a particular type is utilized for the well. In addition, the BDN expert system facilitates the determination of whether certain areas in the field that seemed previously attractive in terms of production should be abandoned, or whether new candidate drilling areas should be pursued based on BDN score values indicating that these new candidate drilling areas have high productivity potential. To that end, the probability scores generated by the BDN model may influence a decision whether to place a new well in a certain candidate area. For example, low probability scores generated during a plurality of assessments by the BDN model may lead to the conclusion that a new well should not be placed in a candidate area that previously was of interest based on a preliminary analysis. An area might have good hydrocarbon content, but downhole conditions such as excessive stresses, washouts, or drilling issues could lead to a recommendation, by the expert system using the BDN model, to abandon a plan to drill the well in the candidate area.

Further, areas with reoccurring issues can now be targeted for specific and focused studies to identify the root cause of low productivity. For instance, an area that is associated with low probability values during the plurality of assessments by the BDN model can be identified for specific studies, such as a geo-mechanics study or a study using expensive evaluation tools to understand the root cause of the low probability scores. In addition, a large number of probability values associated with various areas of a field is helpful in generating a contour map or a heat map of the field. Such maps are useful in identifying areas that are potentially very productive or are areas in which a company should avoid investing resources.

Turning to FIG. 1, FIG. 1 illustrates one or more embodiments for placing a lateral wellbore of a well 102 within a lateral pay zone using a geosteering system 100. When planning the location and direction of a lateral within a formation, the BDN model relies on data associated with existing offset wells. The geophysical information available for existing wells in the vicinity of a candidate drilling area provide valuable data for determining an accurate placement of a new well (e.g., the well 102) and its lateral wellbores that result in high production of hydrocarbons from the new well. As the new well is built and laterals are drilled in the planned direction, additional geophysical and geo-mechanical data pertaining to the new well and its laterals are gathered using various available tools (e.g., sensors) and technologies, for continuous productivity analysis of the new well.

As shown in FIG. 1, the geosteering system 100 may include functionality for monitoring various sensor signatures (e.g., an acoustic signature from acoustic sensors) that gradually or suddenly change as a well path traverses a cap rock 118, a pay zone 122, and a bed rock 124. Because of the sudden change in lithology between the cap rock 118 and the pay zone 122, for example, a sensor signature of the pay zone 122 may be different from the sensor signature of the cap rock 118. When the drill bit 126, coupled to drill string 110, drills out of the pay zone 122 into the cap rock 118, a detected amplitude spectrum of a particular sensor type may change suddenly between the two distinct sensor signatures. In contrast, when drilling from the pay zone 122 downward into the bed rock 124, the detected amplitude spectrum may gradually change.

During the lateral drilling of the wellbore 112, preliminary upper and lower boundaries of a formation layer's thickness may be derived from a geophysical survey or an offset well obtained before drilling the wellbore 112. If a vertical section 120 of the well is drilled, the actual upper and lower boundaries of a formation layer (i.e., actual pay zone boundaries (A, A')) and the pay zone thickness (i.e., A to A') at the vertical section 120 may be determined. Based on this well data, an operator may steer the drill bit 126 through a lateral section 128 of the wellbore 112 in real time. In particular, a logging tool may monitor a detected sensor signature proximate the drill bit 126, where the detected sensor signature may continuously be compared against prior sensor signatures, for example, of the cap rock 118, pay zone 122, and bed rock 124, respectively. As such, if the detected sensor signature of drilled rock is the same or similar to the sensor signature of the pay zone 122, the drill bit 126 may still be drilling in the pay zone 122. In this scenario, the drill bit 126 may be operated to continue drilling along its current path and at a predetermined distance (0.5 h) from a boundary of a formation layer. If the detected sensor signature is same as or similar to the prior sensor signatures of the cap rock 118 or the bed rock 124, respectively, then a control system may determine that the drill bit 126 is drilling out of the pay zone 122 and into the upper or lower boundary of the pay zone 122. At this point, the vertical position of the drill bit 126 at this lateral position within the wellbore 112 may be determined and the upper and lower boundaries of the pay zone 122 may be updated, (for example, positions B and C in FIG. 1). In some embodiments, the vertical position at the opposite boundary may be estimated based on the predetermined thickness of the pay zone 122, such as positions B' and C'.

While FIG. 1 illustrates a configuration of components, other configurations may be used without departing from the scope of the disclosure. For example, various components in FIG. 1 may be combined to create a single component. As another example, the functionality performed by a single component may be performed by two or more components.

Figure 2:
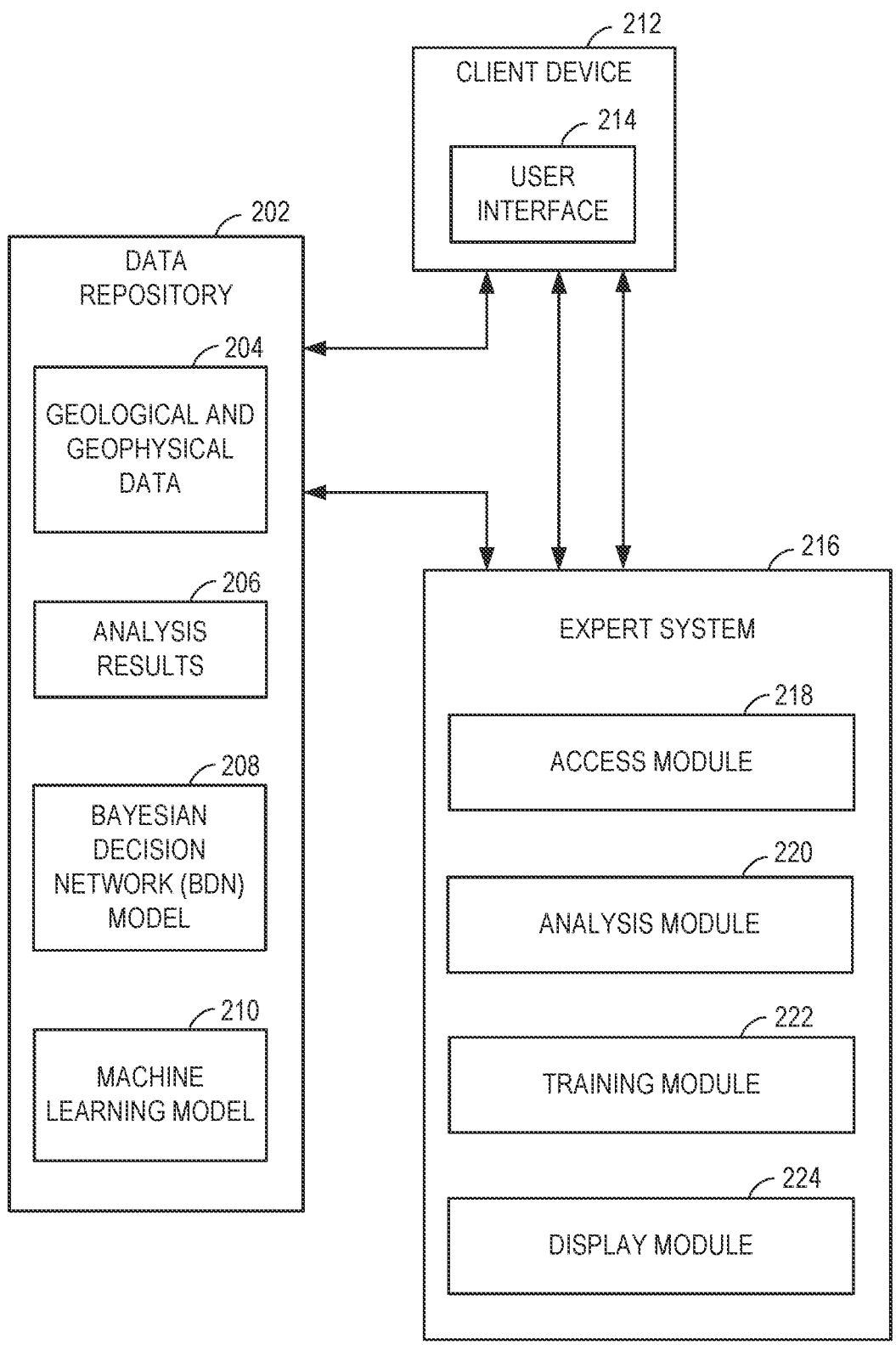
FIG. 2 is a block diagram that illustrates an expert system, according to one or more example embodiments.

FIG. 2 is a block diagram that illustrates the expert system, according to one or more example embodiments. In FIG. 2, the expert system 216 is operatively connected to a client device 212 and a data repository 202. The expert system 216 is shown as including access module 218, analysis module 220, training module 222, and display module 224. The components of the expert system 216 are operatively connected and are configured to communicate with each other (e.g., via a wire, a cable, a bus, shared memory, a switch, wirelessly, etc.).

The access module 218 is configured to access, from a database (e.g., the data repository 202), geological and geophysical data 204 associated with a candidate area for drilling a first well and with an area of a second, nearby well. The geological and geophysical data 204 may include data extracted from geological or geophysical maps, offset well log data, and actual wellbore log data obtained during and after the well is drilled. The data repository 202 may be any type of storage, such as non-persistent storage (e.g., random access memory (RAM), cache memory, or flash memory), one or more persistent storage (e.g., a hard disk), or any other suitable type of memory capable of storing data within data structures such as arrays, lists, tables, etc.

The analysis module 220 is configured to perform a first assessment of a data availability score value, saturation data, fracture data, and seismic data included in the geological and geophysical data associated with a candidate area for drilling the first well. The first assessment is performed using a Bayesian Decision Network (BDN) model. The analysis module 220 is further configured to output, based on the first assessment, a first probability value that indicates a potential level of production of the first well if drilled in the candidate area.

The analysis module 220 is further configured to perform a second assessment of an offset data score value, stress data, thickness data, and porosity data included in the geological and geophysical data associated with the second, nearby well. The second assessment is performed using the BDN model. The analysis module 220 is further configured to output, based on the second assessment, a second probability value. The second probability value indicates a potential level of production of the first well if a lateral wellbore is placed in a particular layer and at a particular azimuth direction in a reservoir associated with the candidate area.

The analysis module 220 is further configured to perform a third assessment of tortuosity data, washout data, porosity data, and a net-to-gross value associated with the first well. The third assessment is performed using the BDN model. The analysis module 220 is further configured to output, based on the third assessment, a third probability value that indicates the well completion type for the first well.

The analysis module 220 may be implemented using hardware (e.g., one or more processors of a machine) or a combination of hardware and software. For example, the analysis module 220 may configure a processor to perform the operations described herein for the analysis module 220. According to another example, the analysis module 220 is a hardware processor that performs the operations described herein for the analysis module 220. In some example embodiments, the analysis module 220 may be distributed across multiple machines or devices.

The training module 222 is configured, in some example embodiments, to train and test the BDN model, based on geological and geophysical data associated with the second, nearby well, to perform the first assessment, output the first probability value, perform the second assessment, output the second probability value, perform the third assessment, and output the third probability value. The training module 222 is further configured to train the BDN model to generate a final score value that indicates a potential level of production of the first well if the first well is drilled in the candidate area, the lateral wellbore is placed in the particular layer and at the particular azimuth direction, and the well completion type is utilized for the first well. The generating of the final score value is based on a combination of the first probability value, the second probability value, and the third probability value.

In various example embodiments, the training module 222 trains and tests a single model that uses clustering-friendly Artificial Intelligence (AI) algorithms, such as Support Vector Machine (SVM). In certain example embodiments, three AI algorithms corresponding to the three assessments may be built separately. Each AI algorithm generates its own score. These scores are then combined to generate a well potential value corresponding to the target well.

The display module 224 is configured to cause display of a recommendation in a user interface of a client device. In some example embodiments, the recommendation references a well completion type for the first well. In certain example embodiments, the recommendation is to adjust a drilling operation based on a determination that the final score value is below a threshold value.

The expert system 216 is also configured to communicate with a client device 212 that includes the user interface 214. In some example embodiments, a user of the client device 212 accesses the expert system 216 via the user interface 214. The user may, for example, make configuration changes to the one or more modules included in the expert system 216. The client device 212 is also configured to communicate with the data repository 202 to access and store data.

As shown in FIG. 2, in addition to the geological and geophysical data, the data repository 202 stores analysis results 206. The analysis results 206 may include a first probability value determined based on the first assessment, a second probability value determined based on the second assessment, and a third probability value determined based on the third assessment. In addition, the data repository 202 stores one or more Bayesian Decision Network (BDN) models 208 and one or more machine learning models 210.

Figure 3:
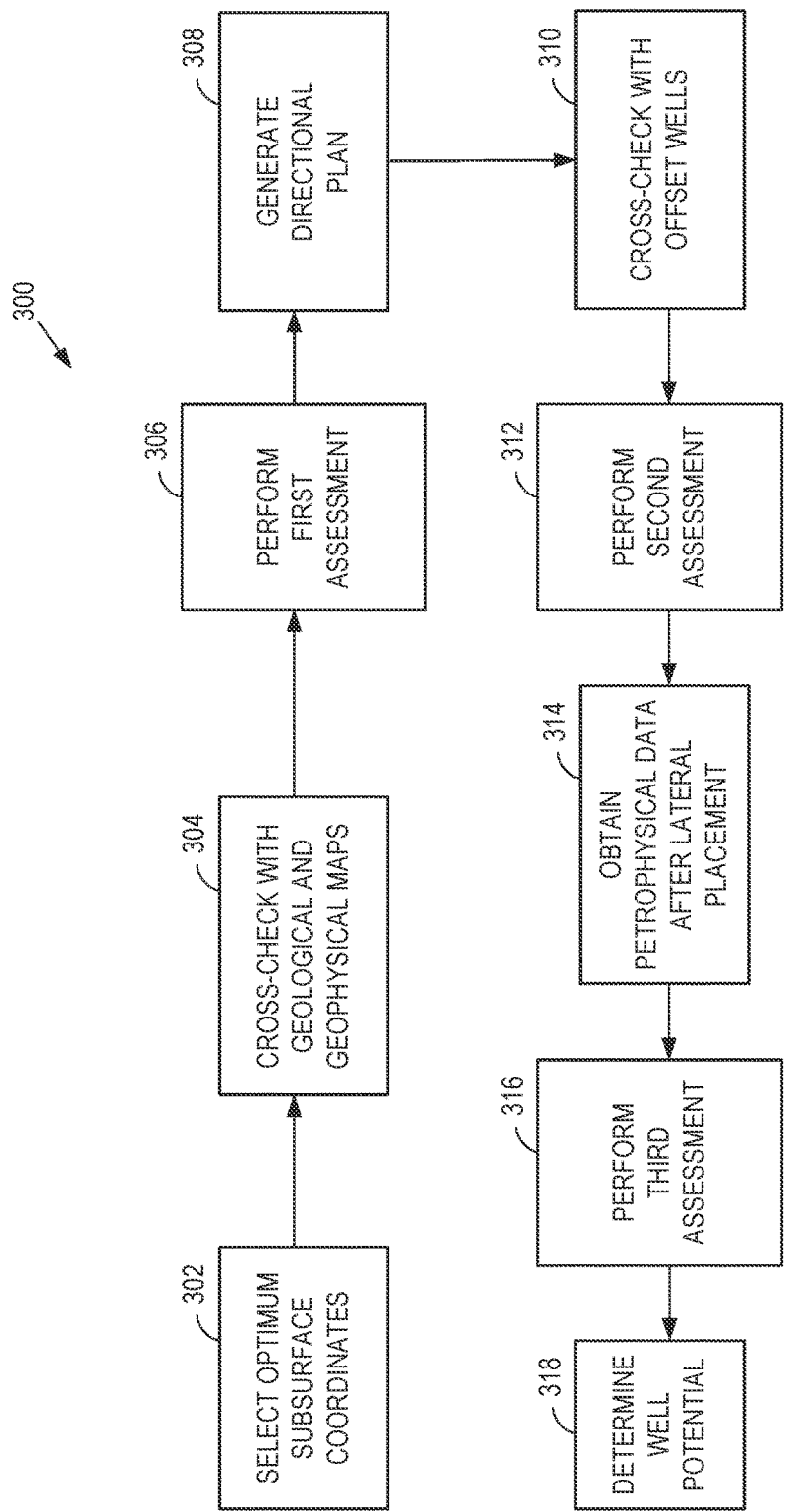
FIG. 3 is a flow diagram that illustrates an algorithm for selecting a location for a well using an expert system, according to one or more example embodiments.

FIG. 3 is a flow diagram 300 that illustrates an algorithm for selecting a location for a well using an expert system, according to one or more example embodiments. In some example embodiments, one or more steps shown in flow diagram 300 are performed by the expert system 216.

As shown in FIG. 3, at Step 302, optimum subsurface coordinates are selected. The optimum surface coordinates ensure the reaching of target subsurface coordinates (x, y, z) with the shortest path possible, while avoiding potential surface or subsurface problems, such as wellbore instability, faults, or thief-zones. For example, once the target field boundary is defined, the expert system 216 selects an optimum surface location based on data pertaining to surface availability (e.g., no mountain or obstruction), surface or downhole spacing (e.g., wells should be close to each other), and optimum sweet spots (e.g., zones rich in hydrocarbons and few downhole issues). To maximize the chances of drilling a productive well, data pertaining to the Earth's subsurface is collected both before and during drilling. Data is collected at a variety of scales, from regional to microscopic. The subsurface data can help to identify potential hazards such as earthquake-prone zones or areas of potential land subsidence and sinkhole formation. An area that avoids the above-mentioned hazards may be selected as a candidate for drilling a well.

At Step 304, the geological and geophysical maps of the candidate area (hereinafter also "targeted area") are cross-checked with the geological and geophysical maps of one or more offset wells to determine if the candidate area has faults or fractures that can hinder the drilling operations, and whether seismic maps show anomalies, such as kike caves, vugs (i.e., a cavity in rock, lined with mineral crystals) or thief zones (i.e., loss circulation zones). Seismic images provide detailed regional information about the structure of the subsurface, including buried faults, folds, salt domes, and the size, shape, and orientation of rock layers. The seismic images are collected by using truck-mounted vibrators or dynamite (onshore), or air guns towed by ships (offshore), to generate sound waves. The sound waves travel into the Earth and are reflected by underground rock layers. Instruments at the surface record these reflected waves, and the recorded waves are mathematically processed to produce two-dimensional (2D) or three-dimensional (3D) images of subsurface features. These images, which cover many square miles and have a resolution of tens to hundreds of feet, help to pinpoint the areas most likely to contain oil, gas, or both. Based on the above-mentioned data, a determination is made with respect to whether the candidate area includes hydrocarbon saturations from which oil or gas could be extracted.

In some example embodiments, geological and geophysical maps include data pertaining to reservoir structure (e.g., existence of trapping structures), reservoir size (e.g., whether the drainage area is large or small), the presence of faults or fractures (e.g., such items may increase drilling difficulties), seismic maps that may indicate anomalies such as fractures, faults, vugs, saturation maps that may indicate how rich in hydrocarbon the target area is, and porosity maps (does the area has high or low porosity). These maps are initially generated and populated based on statistical analysis. Upon drilling a well and collecting drilling and downhole data for the drilled well, these maps are updated based on actual collected data. A cross-check is performed between proposed surface coordinates and the target area maps. For example, x and y coordinates are selected. The coordinates are placed on the maps, and analysis is performed with respect to whether the area identified by the coordinates has good or bad saturation, whether multiple faults or fractures exist in the proposed area, and whether the proposed area has good or poor porosity. If the results of the cross-check analysis are not encouraging, then another area or new proposed coordinates are considered. The output of the analysis performed at step 304 is a binary determination of whether the proposed coordinated are associated with a good location or place for a lateral, or whether the coordinates identify a poor location.

At Step 306, the expert system performs a first assessment of data associated with the candidate drilling area and generates a first probability value. The first assessment helps to identify an adequate (e.g., most productive) drilling area for locating a well. During the first assessment, the expert system determines whether sufficient geological and geophysical data, maps, and reservoir structure information is available to help select the best candidate drilling area. Reservoir structure refers to the reservoir's shape downhole. It also captures the inclination and thickness. A poor reservoir structure indicates that a lateral cannot be placed easily, or that it could go upward, against gravity. Sufficient data refers to the number of offset wells needed to perform the assessment. The data availability value is informative to prevent labeling any well as successful based on a few data points. A value between 0.0 and 1.0 indicates the quantity and quality of available data. For example, in high uncertainty area, the cutoff could be placed at six wells. Thus, having three nearby wells yields 3/6=0.5. For more certain areas, a lower well count may be sufficient. The higher the number, the higher the confidence in the analysis.

Another value considered during the first assessment is a saturation value. The saturation value indicates whether hydrocarbons are present in the candidate area.

A fracture value is a third value considered during the first assessment. The fracture value indicates the number of fractures in a candidate area. For example, a high fracture value indicates an area in which the drilling of a new well should be avoided because fractures introduce multiple drilling difficulties (e.g., losses) even though a presence of fractures in a formation enhances the production rate.

A further factor considered during the first assessment is the level of seismic activity in the candidate drilling area. The saturation, fracture, and seismic values are determined based on certain sub-categories of data, as discussed below with respect to FIG. 4B.

At Step 308, a directional plan (e.g., a drilling trajectory or pathway) is generated for a certain layer. For example, the location and azimuth for a lateral wellbore is determined based on various offset well data, such as an offset data score value, stress data, thickness data, and porosity data. The azimuth is used in directional drilling as the direction of the wellbore measured in degrees (0-359) clockwise from True North or Magnetic North. The directional plan can be used in directional drilling to intentionally deviate a wellbore in order to reach an objective some distance from the rig.

At Step 310, a cross-check with the offset wells is performed. Offset wells will be cross-checked to identify if drilling difficulties, such as drilling updip (more than 90 degrees against gravity), exist. In a dipping (not flat-lying) hydrocarbon reservoir that contains gas, oil, and water, the gas is updip, the gas-oil contact is downdip from the gas, and the oil-water contact is still farther downdip. In addition, a determination is made whether there are downhole stresses (e.g., a horizontal stress or a vertical stress) that can cause the wellbore to be unstable or collapse. For example, once the directional plan is generated for the target well, the path and trajectory of the target well are compared with offset well data. The offset well data includes lateral length (reservoir contact), inclination and Dog-Leg Severity (DLS), azimuth, stresses, reservoir thickness, etc. The offset well data includes 3D data (e.g., x, y, and z coordinates). The output of Step 310 is a score value, where numbers closer to 0.0 indicate poorer outcomes, and numbers closer to 1.0 indicate higher success.

The reservoir and hence the wellbore in it are subject to a number of stresses. A first stress is the vertical, overburden stress caused by the weight of the rock above pushing down on the reservoir. In addition, many regions are subject to tectonic stresses. These are horizontal stresses that build mountains, cause earthquakes, or create rifts. Often the horizontal forces are small, but present nonetheless. Usually, but not always, the vertical stress is the biggest. There is also the stress of the fluid in the wellbore, which may sometimes be enough to cause fractures. In some instances, the presence of the wellbore can focus stresses in because the wellbore may be filled at a lower pressure (stress) than the surrounding rock.

At Step 312, the expert system performs a second assessment of geological and geophysical data associated with an existing, nearby well and generates a second probability value. The second assessment helps to determine a lateral trajectory and placement of the lateral within the candidate area across a selected layer and azimuth direction (e.g., a layer and azimuth direction determined to be the most productive).

A first value considered during the second assessment is an offset data value that indicates the number of existing offset wells. The offset data value is informative to prevent labeling any well as successful or productive based on a small number of nearby wells. A value between 0.0 and 1.0 indicates the richness of the well count of the nearby wells.

Another value considered during the second assessment is a stress value that indicates the number of downhole forces acting on the wellbore, their strengths, and whether any of the nearby wells encountered difficulties due to these stresses. The forces that act on the wellbore affect the ability to drill and place laterals. The stress value is represented by a number indicating pounds per square inches (psi). There are three stress directions: vertical, maximum horizontal, and minimum horizontal. The vertical stress (i.e., in the z direction) represents the weight of one or more formations on the wellbore from above. For example, if the lateral is 10,000 ft deep, then the vertical stress indicates the weight of the 10,000 ft of formation on the lateral. The minimum horizontal stress (i.e., in the x direction) and the maximum horizontal stress (i.e., in the y direction) are acting sideways on the lateral. The maximum horizontal stress is greater than the minimum horizontal stress. The stress value may be determined based on stress-maps, actual stress value and direction identified by downhole sensors, geo-mechanical modeling, or post-hydraulic-fracturing data.

A further value considered during the second assessment is a thickness value that captures the height of a reservoir. A reservoir associated with a greater thickness value (i.e., a thicker reservoir) is easier to target and often is more prolific. However, thickness does not always indicate hydrocarbon presence. In some example embodiments, the reservoir thickness value is determined using maps of the entire field (e.g., the first assessment). When a well is drilled, the actual reservoir top (i.e., the top or beginning of the geological formation) and the reservoir bottom are identified. The thickness is determined by subtracting the top from the bottom. Formation cutting or downhole logging and evaluation tools can help to determine the beginning and end of the reservoir.

A fourth value considered during the second assessment is a porosity value that indicates the level of porosity of a formation associated with one or more nearby wells. Each reservoir is characterized by a certain level of heterogeneity. However, if multiple offset wells exhibit good formation porosity, then it may be expected that the target well will also contain good porosity. In some example embodiments, a cutoff value based on a reservoir type may be defined. For example, a porosity value in the range of five percent to ten percent for shale is considered to be good porosity. A porosity value in the range of ten percent to twenty percent for sandstone or carbonate is also considered to be good porosity. Generally, a porosity value above twenty-five percent porosity is considered to be very good. The stress, thickness, and porosity values are determined based on certain sub-categories of data, as discussed below with respect to FIG. 5.

At Step 314, petrophysical data is obtained along the trajectory of the well drilled in the candidate area, after the lateral is placed within the formation. This petrophysical data is used to perform a third assessment.

At Step 316, the expert system performs the third assessment of the actual petrophysical data gathered from the target well after it is drilled and generates a third probability value. The third assessment helps to select the most appropriate type of completion to unlock the maximum potential of the well. For example, a cemented liner is good for washed-out holes (i.e., the wellbore's inside diameter (ID) is larger than the bit used). The cement fills all the voids and vugs such that an essential stimulation job (e.g., plug-and-perf or hydraulic fracturing) can be performed. If the wellbore is intact, then Multi-Stage Fracturing (MSF) completion may be selected because it allows for faster and more efficient stimulation and because there is no reservoir damage from the cement. Also, MSF may be used when it is not desirable to cement natural fractures. If the well has high dog-leg severity (DLS) or a tortuous path, then a cemented liner is preferred. If there is a high probability of a stuck pipe incident, then a cemented liner is preferred such that perforation and stimulation can be done at any depth. This may alleviate concerns regarding packer spacing or miss-spacing, especially if the completion did not reach the target depth.

A first value considered during the third assessment is a tortuosity value that indicates how smooth the wellbore is to facilitate running the completion since it is not as flexible as the drilling assembly.

A second value considered during the third assessment is a washout value that indicates whether the wellbore inner diameter is bigger than the planned hole size. A wellbore that has a larger inner diameter than the planned hole size is likely to hinder running a specific type of completion that required a certain wellbore size. For example, a value of 1.0 indicates that the wellbore is gauged. If the wellbore is larger than the planned hole size by five percent, then the washout value is 0.5. If the wellbore is larger than the planned hole size by ten percent, then the washout value is 0.0. The value of five percent is associated with the maximum tolerance that MSF packers can withstand. Larger values (i.e., greater than five percent) indicate that the MSF will not isolate properly. The cutoff value of five percent can change at any time based on different MSF technology. For the range of five percent to ten percent, a cemented liner is used since the wellbore is washed-out. If the wellbore is larger than the planned hole size by more than ten percent, logging and evaluation tools will likely not work properly to evaluate the wellbore. As a result, a better solution may be to drill a new lateral next to the wellbore.

A third value considered during the third assessment is a porosity value that indicates a porosity level of the formation and that aids in the selecting of the zones from which to produce. The porosity value also indicates how large these zones are.

A fourth value considered during the third assessment is a net-to-gross value that is calculated based on porosity data and, in some instances, washout data. The net-to-gross value provides information regarding the percentage of the wellbore that can contribute to production. In some example embodiments, the net-to-gross value is determined using a net-to-gross ratio, i.e., by dividing a distance over a good porosity zone (i.e., the "net") by the distance of a lateral (i.e., the "gross"). For example, if the lateral is 4,000 ft, but only 1,000 ft of the 4,000 ft are across good porosity zone, then the net-to-gross ratio is 1,000/4,000=0.25, and the net-to-gross value is 0.25 (i.e., 25%). If the net-to-gross ratio is 0.0, then the lateral is "dry," and no hydrocarbon or porosity is present. If the net-to-gross ratio is 1.0, then there is maximum coverage.

In some example embodiments, the factor of the washed-out zone is also considered when determining the net-to-gross value. For example, out of 4,000 ft lateral, only 1,000 ft has porosity, but out of this 1,000 ft, only 500 ft is a gauged hole (i.e., can install MSF across it). In this case, the net-to-gross ratio is 500/4,000=0.125, and the net-to-gross value is 0.125 (i.e., 12.5%). The tortuosity, washout, and porosity values are determined based on certain sub-categories of data, as discussed below with respect to FIG. 6.

At Step 318, the potential of the well is determined. The potential of the well may be represented by a final score value that indicates a potential level of production of the first well if the first well is drilled in a particular candidate area, the lateral wellbore is placed in a particular layer and at a particular azimuth direction, and a particular well completion type is utilized for the well. The final score value is generated based on a combination of the first probability value, the second probability value, and the third probability value.

A higher final score value indicates a higher probability of success of the well. In some example embodiments, a final score value that is below a threshold well potential value indicates a poor well that should not be completed or that a new, more productive lateral should be drilled.

Figure 4:
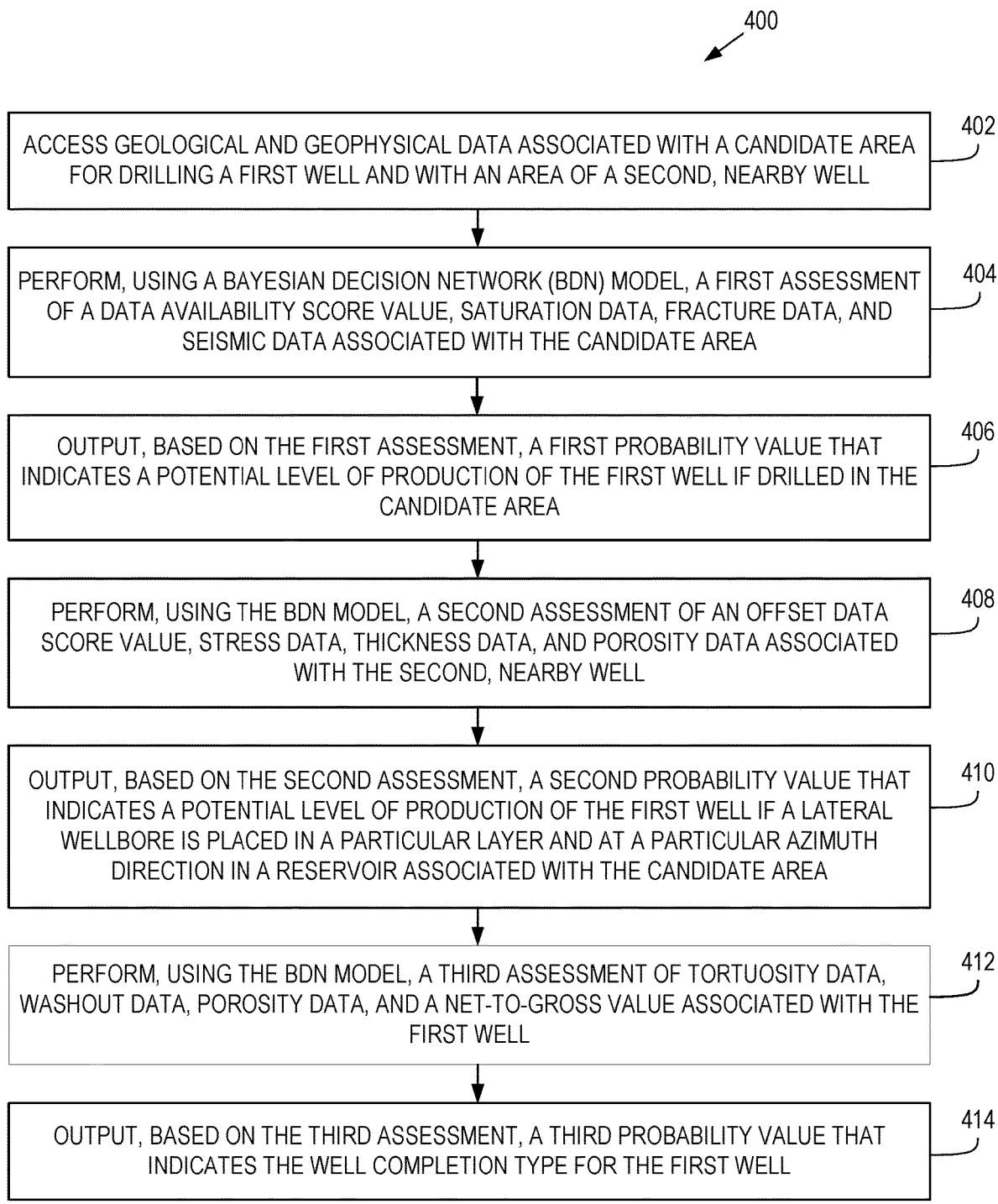
FIG. 4 is a flowchart illustrating operations of the expert system in performing a method for selecting a location for a well using a Bayesian Decision Network, according to one or more example embodiments.

FIG. 4 is a flowchart illustrating operations of the expert system in performing a method for selecting a location for a well using a Bayesian Decision Network, according to one or more example embodiments. Steps of the method 400 may be performed using the components described above with respect to FIG. 2. One or more blocks in FIG. 4 may be performed by a computing system such as that shown and described below in FIGS. 9A and 9B. While the various blocks in FIG. 4 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

At Step 402, the access module 218 accesses, from a database, geological and geophysical data associated with a candidate area for drilling a first well and with an area of a second, nearby well.

At Step 404, the analysis module 220 (e.g., a processor) performs, using a Bayesian Decision Network (BDN) model, a first assessment of a data availability score value, saturation data, fracture data, and seismic data included in the geological and geophysical data associated with the candidate area for drilling the first well. In some example embodiments, the data availability score value indicates an amount of available data to perform the first assessment. The saturation data includes a saturation value determined based on at least one of a water value that indicates an amount of water included in the candidate area, an oil value that indicates an amount of oil included in the candidate area, or a gas value that indicates an amount of gas included in the candidate area. The fracture data includes a fracture value determined based on at least one of a sealing value that indicates an extent to which a fracture is sealed, a fracture density value, an orientation value, a height value that indicates a height of the fraction, or a length value that indicates a length of the fracture. On one hand, drilling challenges may be mitigated if the fractures are open and connected. On the other hand, the well production may be increased if the fractures are sealed and they can be reopened after drilling through well stimulation (e.g., hydraulic fracturing). Fracture density reflects the count or number of fractures in a specific area. For example, a high fracture density value indicates that there are multiple fractures near to each other in the particular area. Further, orientation is the direction of the fracture. The orientation value indicates whether the wellbore path will intersect the fractures or pass parallel to them.

The seismic data includes a seismic value determined based on at least one of a seismic anomaly value that indicates a quantity of anomalies in the candidate area, a thickness value that indicates a thickness of a targeted layer, or a formation porosity value that indicates a level of porosity associated with a formation in the candidate area. In some example embodiments, an anomaly is a bright spot on a map that cannot be interpreted. Seismic data is generated from sonic waves transmitted toward the earth. If there is a vug, a cave, or a discontinuity, then the sonic waves will not transmit efficiently, which will cause the generation of a bright spot in the map. In some instances, the target layer is a result of seismic processing, geological study, and drilling an exploration well.

At Step 406, the analysis module 220 outputs, based on the first assessment, a first probability value that indicates a potential level of production of the first well if drilled in the candidate area. Further details about the determination of the first probability value are provided below with respect to FIG. 9.

At Step 408, the analysis module 220 performs, using the BDN model, a second assessment of an offset data score value, stress data, thickness data, and porosity data included in the geological and geophysical data associated with the second, nearby well. In various example embodiments, the offset data score value indicates a number of nearby wells (e.g., the number of other wells located within a certain radius from the first well) that are successful. For example, out of ten offset wells, only six show commercial gas saturation. This information may be represented by the ratio of 6/10=0.6, where 0.6 is the offset data score. The stress data includes a stress value determined based on at least one of an overbalance value, a stability value, a maximum horizontal stress value, a minimum horizontal stress value, or an anisotropy value that indicates an overburden pressure value. The overbalance value, measured in psi or lbs/in$^2$, is the difference between the hydrostatic pressure and the formation pressure. The thickness data includes a thickness value determined based on at least one of an up-or-down dipping value or a thick-or-thin value. In some example embodiments, a thick formation is defined having a height of 10 ft or more. A thin formation is less than 10 ft in height. Updip is anything above 90 degrees (90 is pure horizontal). Downdip is below 90 degrees (usually, between 80 degrees and 90 degrees because inside the reservoir less than 80 degrees is rarely done in horizontal wells). The porosity data associated with the second, nearby well includes a nearby-well porosity value determined based on at least one of a nearby-well anomaly value, a nearby-well continuous porosity value, or a nearby-well value. In some example embodiments, continuous porosity happens when good porosity zones extend for at least one MSF or perforation stage. One stage of completion or stimulation is trapped between two openhole packers. A good stage is between 150 ft and 450 ft stage. Discontinuous porosity areas are small chunks scattered only on 10-50 ft span and it is not feasible to combine them in on stage. Moreover, if a 4,000 ft lateral had 1,000 ft of good porosity, then having this 1,000 ft of continuous porosity is better than having 100 ft scattered along the lateral.

At Step 410, the analysis module 220 outputs, based on the second assessment, a second probability value that indicates a potential level of production of the first well if a lateral wellbore is placed in a particular layer and at a particular azimuth direction in a reservoir associated with the candidate area. Further details about the determination of the second probability value are provided below with respect to FIG. 9.

At Step 412, the analysis module 220 performs, using the BDN model, a third assessment of tortuosity data, washout data, porosity data, and a net-to-gross value associated with the first well. In some example embodiments, the tortuosity data, washout data, and porosity data associated with the first well are obtained after the first well is drilled in the candidate area, the net-to-gross value is determined after the first well is drilled in the candidate area, and the third assessment is performed after the first well is drilled in the candidate area. In certain example embodiments, the tortuosity data includes a tortuosity value determined based on at least one of a stiffness value, a tortuosity frequency value, or a tortuosity severity value. The tortuosity value indicates the crookedness of the wellbore and how frequent and severe it is. The tortuosity value is derived from actual wellbore trajectory surveys and indicates the type of well completion that can be selected (e.g., flexible vs. stiff). For example, based on the actual well path or trajectory, a simulation can be performed to determine whether MSF is flexible enough to bend through the tortuous path, or whether cement should be used. MSF is stiffer than a cemented liner since it houses openhole packers on the outside.

The washout data includes a washout value determined based on at least one of a washout size value that indicates a size of a washout in a formation associated with the first well, a washout frequency value, or a washout severity value. The washout value indicates the actual size of one or more washouts, determined from actual petrophysical logs associated with the drilled well, and how frequent and severe the washouts are. This indicates the type of well completion that can be selected.

The porosity data associated with the first well includes a well porosity value determined based on at least one of a well value, a well continuous porosity value, or a contact value that indicates a number of feet of the lateral wellbore that extend across a formation with porosity that does not exceed a threshold value. The porosity data is actual lateral porosity that is captured from petro-physical logs. The result will show if the pore throat contains water or hydrocarbon. A high continuous porosity value indicates that several completion stages may be installed across the lateral wellbore. A contact value accounts for how many feet of the lateral wellbore are placed across a good porosity area. Moderate but continuous porosity is preferred because this type of porosity indicates that there is a reasonable reservoir length from which hydrocarbon can be produced.

At step 414, the analysis module 220 outputs, based on the third assessment, a third probability value that indicates the well completion type for the first well. Further details about the determination of the third probability value are provided below with respect to FIG. 9.

In some example embodiments, the analysis module 220 generates a recommendation that references the well completion type for the first well. The recommendation may be generated based on the third probability value. The display module 224 causes display of the recommendation in a user interface of a client device.

In various example embodiments, the analysis module 220 generates a final score value that indicates a potential level of production of the first well if the first well is drilled in the candidate area, the lateral wellbore is placed in the particular layer and at the particular azimuth direction, and the well completion type is utilized for the first well. The generating of the final score value is based on a combination of the first probability value, the second probability value, and the third probability value.

In certain example embodiments, the analysis module 220 determines that the final score value is below a threshold value and generates a recommendation to adjust a drilling operation based on the determining that the final score value is below the threshold value. The display module 224 causes display of the recommendation in a user interface of a client device.

According to some example embodiments, a training module 222 trains the BDN model to perform the first assessment, output the first probability value, perform the second assessment, output the second probability value, perform the third assessment, and output the third probability value. The training of the BDN model may be based on geological and geophysical data associated with the second, nearby well.

In various example embodiments, the training module 222 trains the BDN model to generate a final score value that indicates a potential level of production of the first well if the first well is drilled in the candidate area, the lateral wellbore is placed in the particular layer and at the particular azimuth direction, and the well completion type is utilized for the first well. The generating of the final score value is based on a combination of the first probability value, the second probability value, and the third probability value.

Figure 5A:
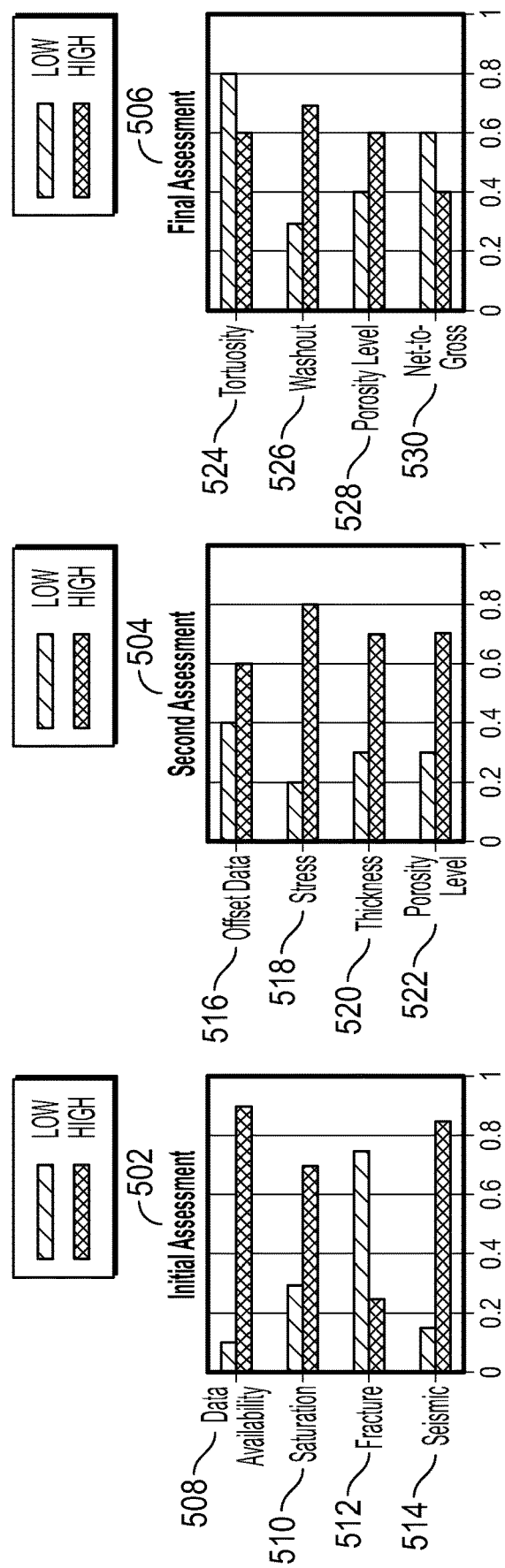
FIG. 5A is a diagram illustrating three assessment stages in the algorithm for selecting the location for the well using the expert system, according to one or more example embodiments.

FIG. 5A is a diagram illustrating three assessment stages in the algorithm for selecting the location for the well using the expert system, according to one or more example embodiments. As shown in FIG. 5A, the initial assessment 502 is performed, by the expert system 216, based on the data availability value 508, the saturation value 510, the fracture value 512, and the seismic value 514.

The second assessment 504 is performed, by the expert system 216, based on the offset data value 516, the stress value 518, the thickness value 520, and the porosity level 522. The final, third assessment 506 is performed, by the expert system 216, based on the tortuosity value 524, the washout value 526, the porosity level 528 and the net-to-gross value 530. In some example embodiments, the values 510-530 include numbers between 0.0 and 1.0.

In FIGS. 5A-7, each category of data is represented by two bars—a "low" value (i.e., a low probability) and a "high" value (i.e., a high probability). The sum of the low value and the high value is 1.0. Upon determining the value that represents a particular category of data, a difference is determined between 1.0 and the determined value that represents the particular category of data. Based on whether the actual value that represents the particular category of data is below or above 0.5, this value is represented with either the "low" bar or the "high" bar. For example, the data availability value 508 in FIG. 5A is equal to 0.9. Therefore, the data availability value 508 is represented with the "high" bar in FIG. 5A. The difference between 1.0 and 0.9 is represented by the "low" bar. Accordingly, as shown in FIG. 5A, the data availability value 508 indicates that there is a high availability of data for performing the initial assessment 502. According to another example, a first area may exhibit high porosity, which is a good characteristic, and high stress, which is not a good characteristic. A second area, however, exhibits high porosity and low stress. The second area may be selected over the first area.

In some example embodiments, the various types or categories of data considered during each of the assessments 502-506 are associated with certain weight values. In some instances, weight values may be assigned to sub-categories of data described below with respect to FIGS. 5B-7. In some instances, each type of data considered during a particular assessment is given the same weight. In some instances, different weight values are assigned to different types of data utilized during a particular assessment. For example, the initial assessment is performed based on four categories of data. Each category is associated with a 0.25 weight value during the calculation of the first probability value. That means that the first probability is computed as an average of the four numbers representing the four categories of data considered during the first assessment.

Figure 5B:
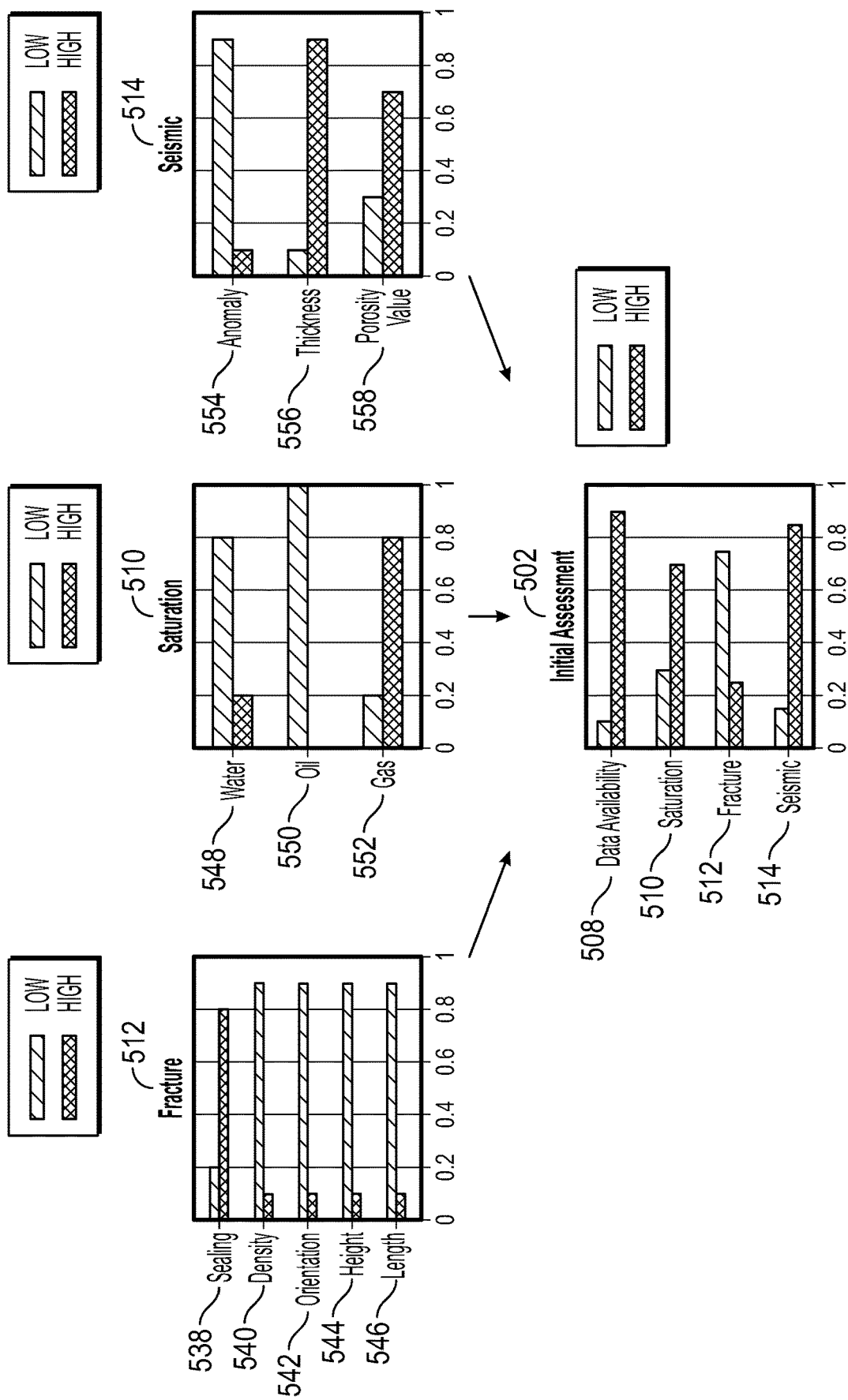
FIG. 5B is a diagram illustrating subcomponents utilized to perform the first assessment in the algorithm for selecting the location for the well using the expert system, according to one or more example embodiments.

Turning to FIG. 5B, FIG. 5B is a diagram illustrating subcomponents utilized to perform the first assessment in the algorithm for selecting the location for the well using the expert system, according to one or more example embodiments. As shown in FIG. 5B, the fracture value 512 is determined, by the expert system 216, based on the sealing value 538, the density value 540, the orientation value 542, the height value 544, and the length value 546.

The saturation value 510 is determined, by the expert system 216, based on the water value 548, the oil value 550, and the gas value 552. The saturation value indicates whether the area contains hydrocarbon or water.

The seismic value 514 is determined, by the expert system 216, based on the anomalies value 554, the thickness value 556, and the porosity value 558.

The seismic value 514 indicates whether certain anomalies, such as faults or surface subsidence, exist in the candidate area. A high seismic value 514 indicates that the candidate area should be avoided to increase the likelihood of success of placing the lateral. The thickness value 556 indicates the thickness of a targeted layer. The porosity value 558 indicates whether the formation is porous. The porosity value 558 is determined based on seismic imaging of the candidate area.

The expert system 216 performs the initial assessment 502 based on the data availability value 508, the saturation value 510, the fracture value 512, and the seismic value 514. The result of the initial assessment 502 is the first probability value that indicates a potential level of production of the first well if drilled in the candidate area.

Figure 6:
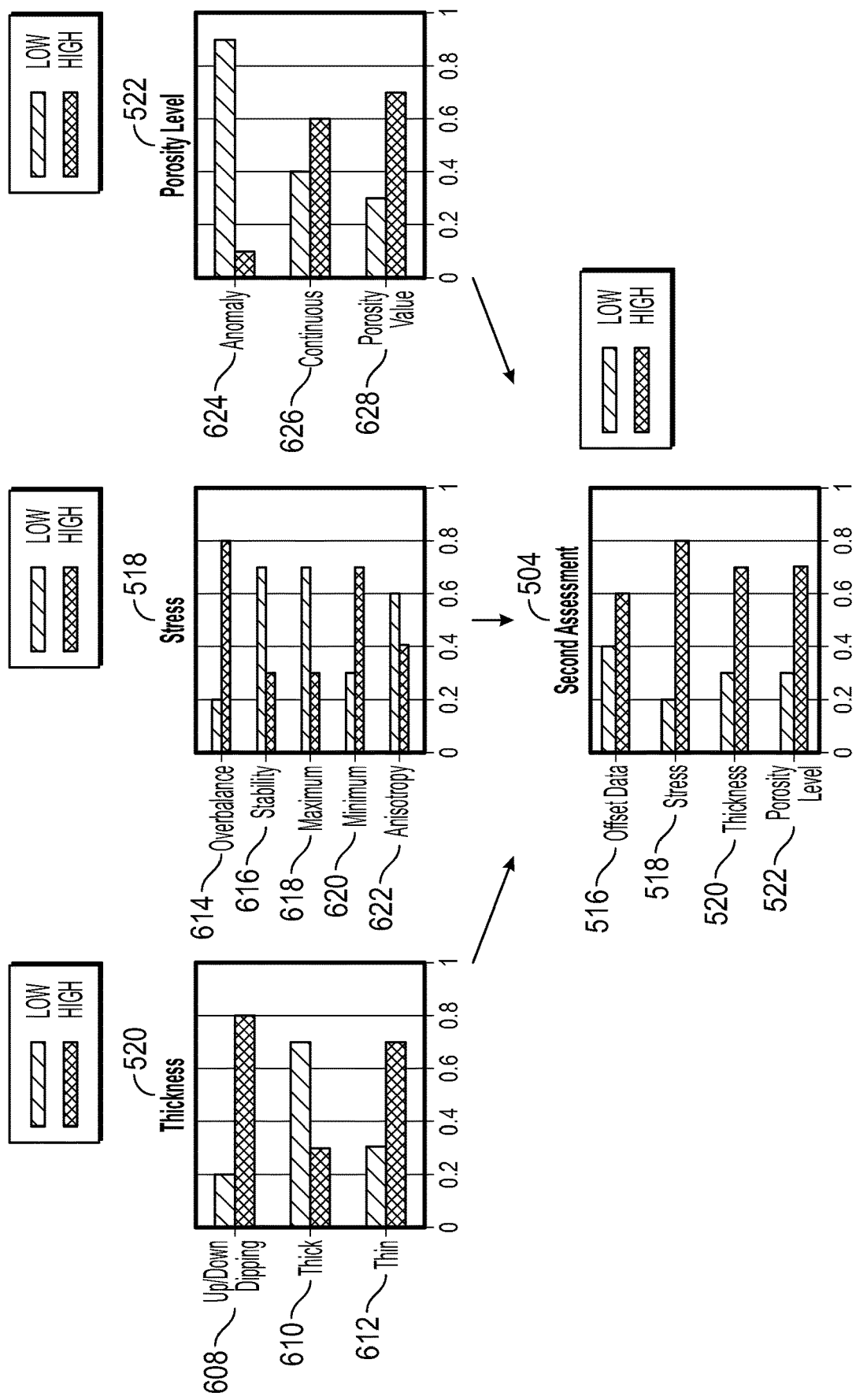
FIG. 6 is a diagram illustrating subcomponents utilized to perform the second assessment in the algorithm for selecting the location for the well using the expert system, according to one or more example embodiments.

FIG. 6 is a diagram illustrating subcomponents utilized to perform the second assessment in the algorithm for selecting the location for the well using the expert system, according to one or more example embodiments. As shown in FIG. 6, the thickness value 520 is determined, by the expert system 216, based on the up/down dipping value 608, the thick value 610, and the thin value 612. Layers that are dipping up or down will dictate the well surface location to minimize drilling up dip against the gravity.

The stress value 518, is determined, by the expert system 216, based on the overbalance value 614, the stability value 616, the maximum stress value 618, the minimum stress value 620, and the anisotropy value 622. The magnitude of the stress value 518 indicates whether more mechanical force (e.g., through mud weight) is needed to stabilize the formation. Also, the difference between the minimum stress value 620 and the maximum stress value 618 can help in selecting the best azimuth direction for the lateral. The anisotropy value 622 accounts for the overburden pressure value.

The porosity level 522 is determined, by the expert system 216, based on the anomaly value 624, the continuous porosity value 626, and the porosity value 628. The anomaly value 624 indicates whether any spikes exist that might lead to drilling or geo-mechanical issues. For example, a spike from 5% porosity to 35% porosity indicates an anomaly. Such an anomaly may be problematic because it may lead to a stuck pipe (i.e., a situation when the drill string cannot be moved from the well).

The expert system 216 performs the second assessment 504 based on the offset data value 516, the stress value 518, the thickness value 520, and the porosity level 522.

Figure 7:
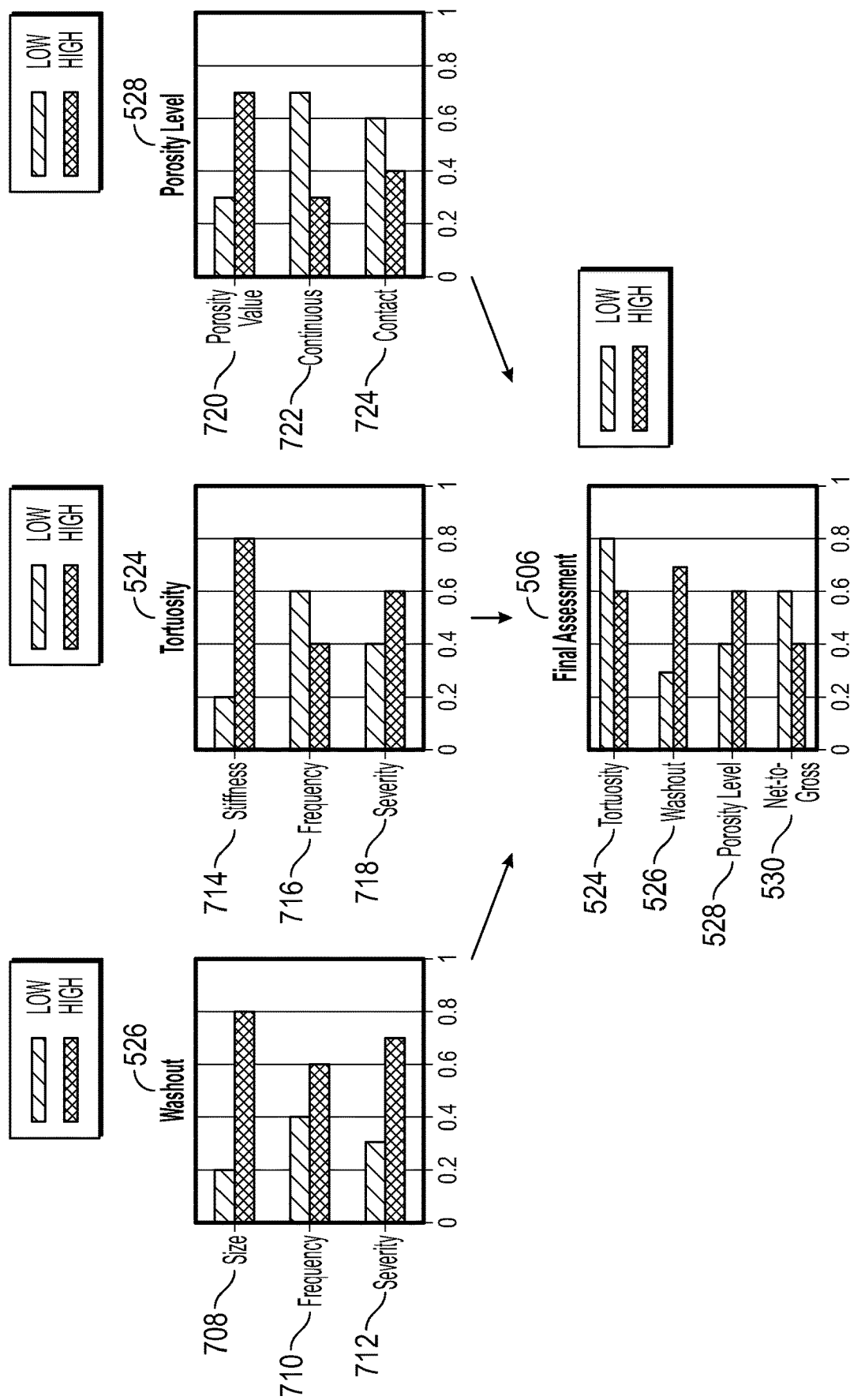
FIG. 7 is a diagram illustrating subcomponents utilized to perform the third assessment in the algorithm for selecting the location for the well using the expert system, according to one or more example embodiments.

FIG. 7 is a diagram illustrating subcomponents utilized to perform the third assessment in the algorithm for selecting the location for the well using the expert system, according to one or more example embodiments. As shown in FIG. 7, the washout value 526 is determined, by the expert system 216, based on the size value 708, the frequency value 710, and the severity value 712.

The tortuosity value 524 is determined, by the expert system 216, based on the stiffness value 714, the frequency value 716, and the severity value 718.

The porosity level 528 is determined, by the expert system 216, based on the porosity value 720, continuous value 722, and contact value 724.

The expert system 216 performs the final assessment 506 based on the tortuosity value 524, the washout value 526, the porosity level 528, and the net-to-gross value 530.

Figure 8:
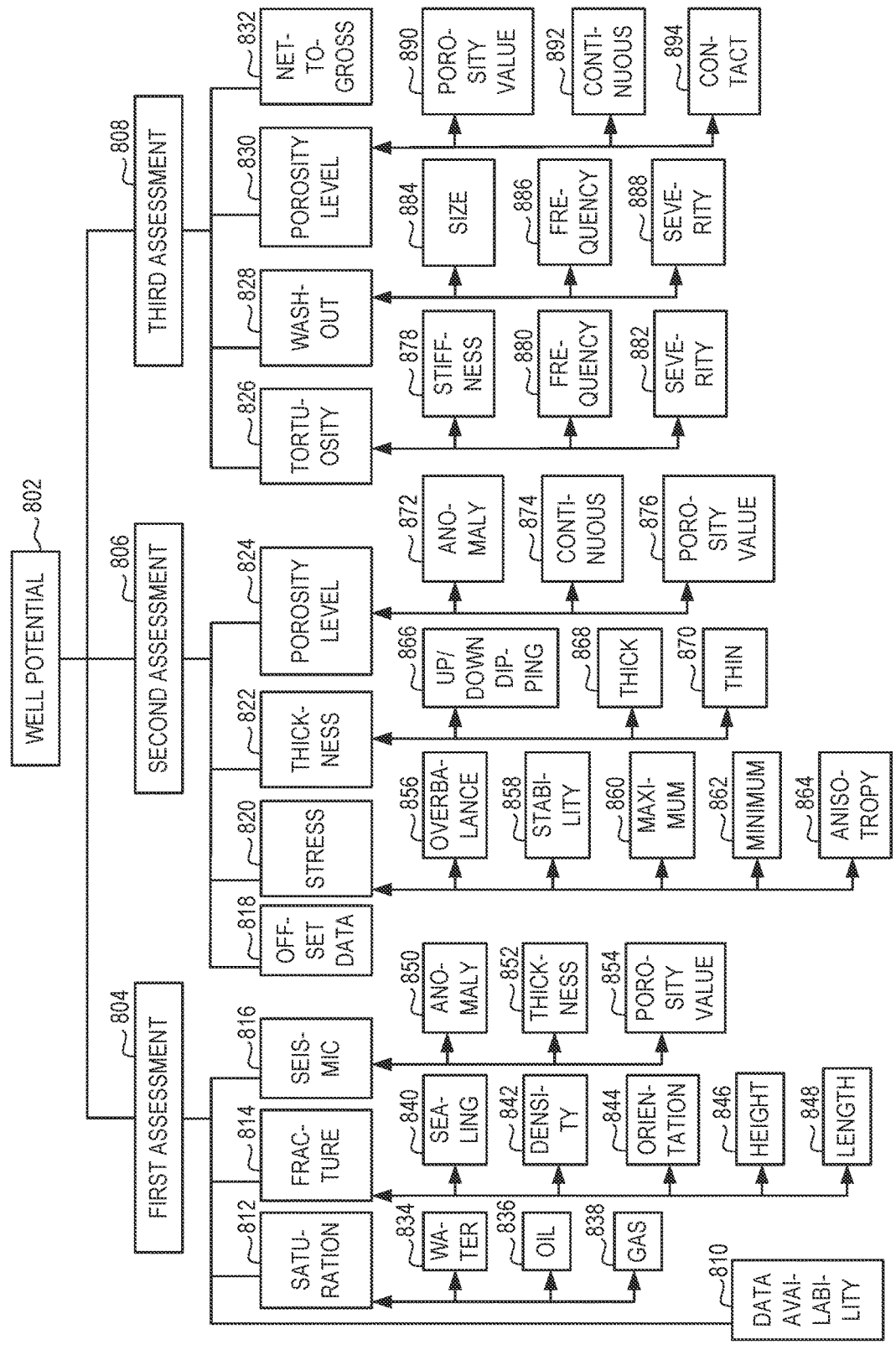
FIG. 8 is a diagram illustrating a decision tree utilized by the expert system, according to one or more example embodiments.

FIG. 8 is a diagram illustrating a decision tree utilized by the expert system, according to one or more example embodiments. As shown in FIG. 8, the production potential of a well may be represented by a well potential value 802. The well potential value 802 may be determined using a first assessment value 804, a second assessment value 806, and a third assessment value 808.

The first assessment value 804 is determined based on the data availability value 810, the saturation value 812, the fracture value 814, and the seismic value 816. The saturation value 812 is determined based on the water saturation value 834, the oil saturation value 836, and the gas saturation value 838. The fracture value 814 is determined based on the sealing value 840, the density value 842, the orientation value 844, the height value 846, and length value 848. The seismic value 816 is determined based on the anomaly value 850, the thickness value 852, and the porosity value 854.

The second assessment value 806 is determined based on the offset data value 818, the stress value 820, the thickness value 822, and the porosity value 824. The stress value is determined based on the overbalance value 856, the stability value 858, the maximum value 860, the minimum value 862, and the anisotropy value 864. The thickness value 822 is determined based on the up/down dipping value 866, the thick value 868, and the thin value 870. The porosity value 824 is determined based on the anomalies value 872, the continuous value 874, and the value 876.

The third assessment value 808 is determined based on the tortuosity value 826, the washout value 828, the porosity value 830, and the net-to-gross value 832. The tortuosity value 826 is determined based on the stiffness value 878, the frequency value 880, and the severity value 882. The washout value 828 is determined based on the size value 884, the frequency value 886, and the severity value 888. The porosity value 830 is determined based on the porosity value 890, the continuous value 892, and the contact value 894.

Figure 9:
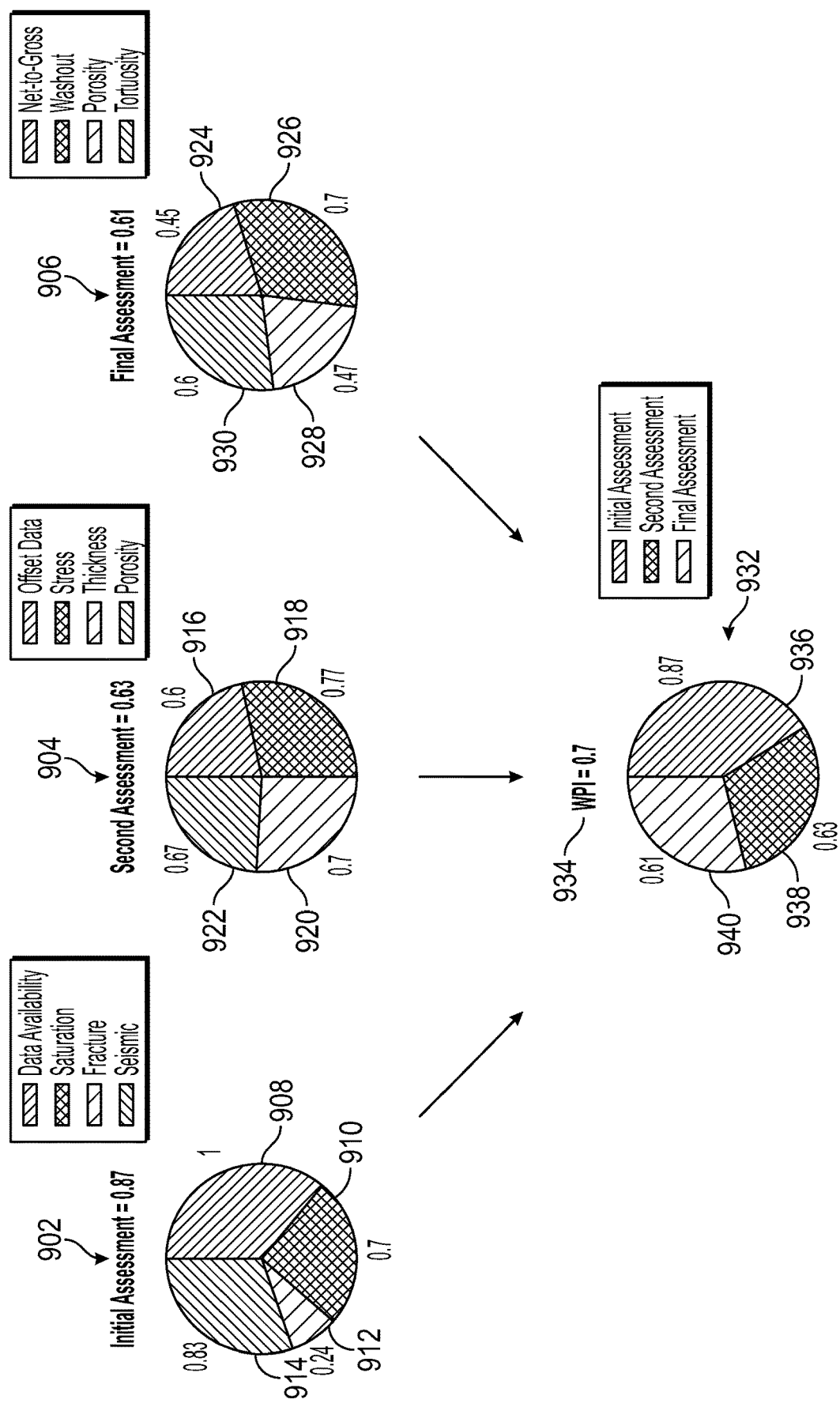
FIG. 9 is a diagram illustrating a plurality of assessments utilized by the expert system, according to one or more example embodiments.

FIG. 9 is a diagram illustrating a plurality of assessments utilized by the expert system, according to one or more example embodiments. As shown in FIG. 9, the expert system 216 performs the initial assessment 902 and generates the first probability value of "0.87" which corresponds to the average of the data availability value 908 (i.e., 1.0), the saturation value 910 (i.e., 0.7), the fracture value 912 (i.e., 0.24), and the seismic value 914 (i.e., 0.84).

Further, the expert system 216 performs the second assessment 904 and generates the second probability value of "0.63" which corresponds to the average of the offset data value 916 (i.e., 0.6), the stress value 918 (i.e., 0.77), the thickness value 920 (i.e., 0.7), and the porosity value 922 (i.e., 0.67).

Next, the expert system 216 performs the final assessment 906 and generates the third probability value of "0.61" which corresponds to the average of the net-to-gross value 924 (i.e., 0.45), the washout value 926 (i.e., 0.7), the porosity value 928 (i.e., 0.47), and the tortuosity value 930 (i.e., 0.6).

In some example embodiments, the expert system 216 performs an assessment 932 to determine the well potential value 934 which corresponds to the average of the first probability value 936, second probability value 938, and third probability value 940. As shown in FIG. 9, the first probability value 936 is equal to "0.87," the second probability value 938 is equal to "0.63," and the third probability value 940 is equal to "0.61." The well potential value 934 generated based on these probability values is equal to "0.7."

Figure 10A:
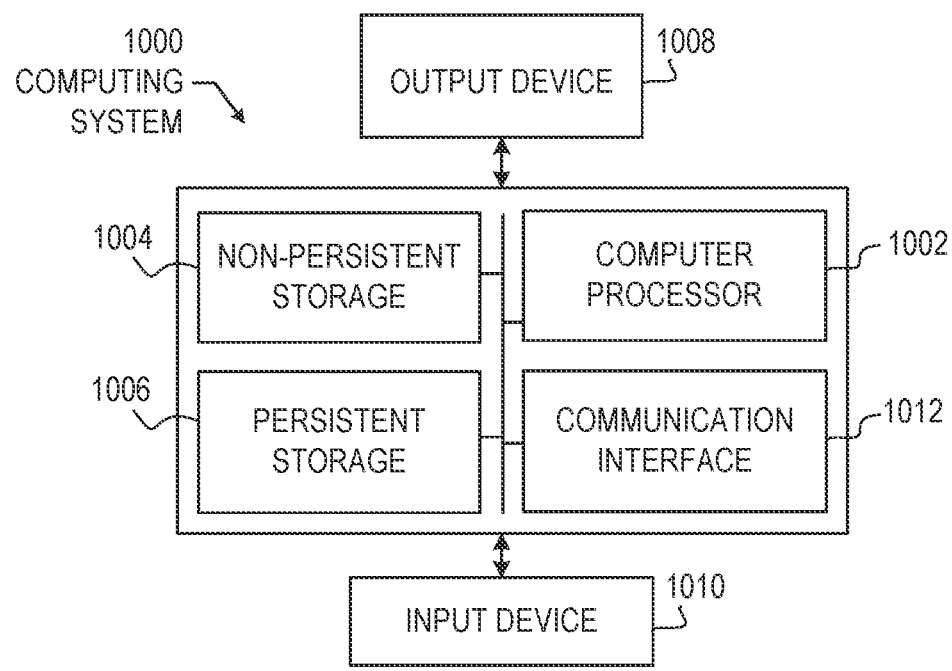
FIGS. 10A and 10B illustrate a computing system, according to one or more example embodiments.

Example embodiments may be implemented on a computing system. Any combination of mobile, desktop, server, router, switch, embedded device, or other types of hardware may be used. For example, as shown in FIG. 10A, the computing system 1000 may include one or more computer processors 1002, non-persistent storage 1004 (e.g., volatile memory, such as random access memory (RAM) or cache memory), persistent storage 1006 (e.g., a hard disk, an optical drive such as a compact disk (CD) drive or digital versatile disk (DVD) drive, or a flash memory), a communication interface 1012 (e.g., Bluetooth interface, infrared interface, network interface, or optical interface), and numerous other elements and functionalities.

The computer processor(s) 1002 may be an integrated circuit for processing instructions. For example, the computer processor(s) 1002 may be one or more cores or micro-cores of a processor. The computing system 1000 may also include one or more input devices 1010, such as a touchscreen, keyboard, mouse, microphone, touchpad, or electronic pen.

The communication interface 1012 may include an integrated circuit for connecting the computing system 1000 to a network (not shown) (e.g., a local area network (LAN), a wide area network (WAN), such as the Internet, mobile network, or any other type of network) or to another device, such as another computing device.

Further, the computing system 1000 may include one or more output devices 1008, such as a screen (e.g., a liquid crystal display (LCD), a plasma display, touchscreen, cathode ray tube (CRT) monitor, or projector), a printer, external storage, or any other output device. One or more of the output devices may be the same or different from the input device(s). The input and output device(s) may be locally or remotely connected to the computer processor(s) 1002, non-persistent storage 1004, and persistent storage 1006. Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s) is configured to perform one or more embodiments of the disclosure.

Figure 10B:
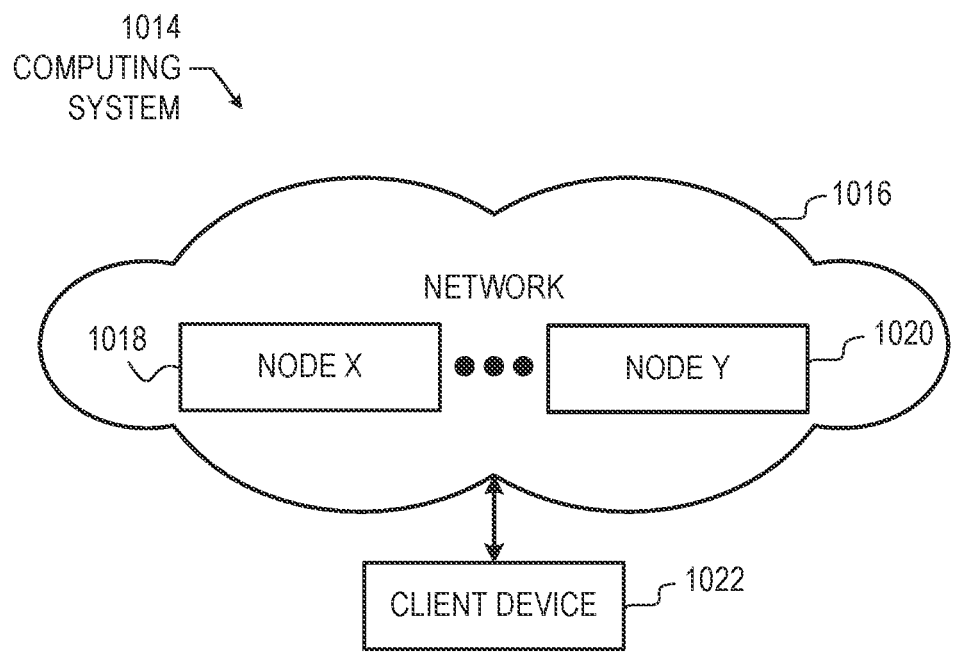

The computing system 1000 in FIG. 10A may be connected to or be a part of a network. For example, as shown in FIG. 10B, the network 1016 may include multiple nodes (e.g., node X 1018 or node Y 1020). Each node may correspond to a computing system, such as the computing system shown in FIG. 10B, or a group of nodes combined may correspond to the computing system shown in FIG. 10B. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system 1014 may be located at a remote location and connected to the other elements over a network.

Although not shown in FIG. 10B, the node may correspond to a blade in a server chassis that is connected to other nodes via a backplane. By way of another example, the node may correspond to a server in a data center. By way of another example, the node may correspond to a computer processor or micro-core of a computer processor with shared memory or resources.

The nodes (e.g., node X 1018 or node Y 1020) in the network 1016 may be configured to provide services for a client device 1022. For example, the nodes may be part of a cloud computing system. The nodes may include functionality to receive requests from the client device 1022 and transmit responses to the client device 1022. The client device 1022 may be a computing system, such as the computing system shown in FIG. 10B. Further, the client device 1022 may include or perform all or a portion of one or more embodiments of the disclosure.

The previous description of functions presents only a few examples of functions performed by the computing system of FIG. 10A and the nodes or client device in FIG. 10B. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed. Accordingly, the scope of the disclosure should be limited only by the attached claims.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed:

1. A system for automatic determining of a well placement and a well completion type, the system comprising:
    one or more hardware processors;
    an access module configured to access, from a database, geological and geophysical data associated with a candidate area for drilling a first well and with an area of a second, nearby well; and
    an analysis module configured to:
        perform, using a Bayesian Decision Network (BDN) model, a first assessment of a data availability score value, saturation data, fracture data, and seismic data included in the geological and geophysical data associated with the candidate area for drilling the first well;

output, based on the first assessment, a first probability value that indicates a potential level of production of the first well if drilled in the candidate area;

perform, using the BDN model, a second assessment of an offset data score value, stress data, thickness data, and porosity data included in the geological and geophysical data associated with the second, nearby well;

output, based on the second assessment, a second probability value that indicates a potential level of production of the first well if a lateral wellbore is placed in a particular layer and at a particular azimuth direction in a reservoir associated with the candidate area;

perform, using the BDN model, a third assessment of tortuosity data, washout data, porosity data, and a net-to-gross value associated with the first well; and output, based on the third assessment, a third probability value that indicates the well completion type for the first well.

2. The system of claim 1, wherein the tortuosity data, washout data, and porosity data associated with the first well are obtained after the first well is drilled in the candidate area, wherein the net-to-gross value is determined after the first well is drilled in the candidate area, and wherein the analysis module performs the third assessment after the first well is drilled in the candidate area.

3. The system of claim 1, wherein the analysis module is further configured to:

generate, based on the third probability value, a recommendation that references the well completion type for the first well, the system further comprising:

a display module configured to cause display of the recommendation in a user interface of a client device.

4. The system of claim 1, wherein the analysis module is further configured to:

generate a final score value that indicates a potential level of production of the first well if the first well is drilled in the candidate area, the lateral wellbore is placed in the particular layer and at the particular azimuth direction, and the well completion type is utilized for the first well, the generating of the final score value being based on a combination of the first probability value, the second probability value, and the third probability value.

5. The system of claim 4, wherein the analysis module is further configured to:

determine that the final score value is below a threshold value; and generate a recommendation to adjust a drilling operation based on the determining that the final score value is below the threshold value, the system further comprising:

a display module configured to cause display of the recommendation in a user interface of a client device.

6. The system of claim 1, further comprising:

a training module configured to train the BDN model, based on geological and geophysical data associated with the second, nearby well, to perform the first assessment, output the first probability value, perform the second assessment, output the second probability value, perform the third assessment, and output the third probability value.

7. The system of claim 6, wherein the training module is further configured to:

train the BDN model to generate a final score value that indicates a potential level of production of the first well if the first well is drilled in the candidate area, the lateral wellbore is placed in the particular layer and at the particular azimuth direction, and the well completion type is utilized for the first well, the generating of the final score value being based on a combination of the first probability value, the second probability value, and the third probability value.

8. The system of claim 1, wherein the data availability score value indicates an amount of available data to perform the first assessment, wherein the saturation data includes a saturation value determined based on at least one of a water value that indicates an amount of water included in the candidate area, an oil value that indicates an amount of oil included in the candidate area, or a gas value that indicates an amount of gas included in the candidate area, wherein the fracture data includes a fracture value determined based on at least one of a sealing value that indicates an extent to which a fracture is sealed, a density value, an orientation value, a height value that indicates a height of the fraction, or a length value that indicates a length of the fracture, and wherein the seismic data includes a seismic value determined based on at least one of a seismic anomaly value that indicates a quantity of anomalies in the candidate area, a thickness value that indicates a thickness of a targeted layer, or a formation porosity value that indicates a level of porosity associated with a formation in the candidate area.

9. The system of claim 1, wherein the offset data score value indicates a number of nearby wells, wherein the stress data includes a stress value determined based on at least one of an overbalance value, a stability value, a maximum stress value, a minimum stress value, or an anisotropy value that indicates an overburden pressure value, wherein the thickness data includes a thickness value determined based on at least one of an up-or-down dipping value or a thick-or-thin value, wherein the porosity data associated with the second, nearby well includes a nearby-well porosity value determined based on at least one of a nearby-well anomaly value, a nearby-well continuous porosity value, or a nearby-well value.

10. The system of claim 1, wherein the tortuosity data includes a tortuosity value determined based on at least one of a stiffness value, a tortuosity frequency value, or a tortuosity severity value, wherein the washout data includes a washout value determined based on at least one of a washout size value that indicates a size of a washout in a formation associated with the first well, a washout frequency value, or a washout severity value, and wherein the porosity data associated with the first well includes a well porosity value determined based on at least one of a well value, a well continuous porosity value, or a contact value that indicates a number of feet of the lateral wellbore that extend across a formation with porosity that does not exceed a threshold value.

11. A method for automatic determining of a well placement and a well completion type, the method comprising:

accessing, from a database and using one or more hardware processors, geological and geophysical data associated with a candidate area for drilling a first well and with an area of a second, nearby well;

performing, using a Bayesian Decision Network (BDN) model and the one or more hardware processors, a first assessment of a data availability score value, saturation data, fracture data, and seismic data included in the geological and geophysical data associated with the candidate area for drilling the first well;

outputting, based on the first assessment and using the one or more hardware processors, a first probability value that indicates a potential level of production of the first well if drilled in the candidate area;

performing, using the BDN model and the one or more hardware processors, a second assessment of an offset data score value, stress data, thickness data, and porosity data included in the geological and geophysical data associated with the second, nearby well;

outputting, based on the second assessment and using the one or more hardware processors, a second probability value that indicates a potential level of production of the first well if a lateral wellbore is placed in a particular layer and at a particular azimuth direction in a reservoir associated with the candidate area;

performing, using the BDN model and the one or more hardware processors, a third assessment of tortuosity data, washout data, porosity data, and a net-to-gross value associated with the first well; and outputting, based on the third assessment and using the one or more hardware processors, a third probability value that indicates the well completion type for the first well.

12. The method of claim 11, wherein the tortuosity data, washout data, and porosity data associated with the first well are obtained after the first well is drilled in the candidate area, wherein the net-to-gross value is determined after the first well is drilled in the candidate area, and wherein the performing of the third assessment is performed after the first well is drilled in the candidate area.

13. The method of claim 11, further comprising:
generating, based on the third probability value, a recommendation that references the well completion type for the first well; and
causing display of the recommendation in a user interface of a client device.

14. The method of claim 11, further comprising:
generating a final score value that indicates a potential level of production of the first well if the first well is drilled in the candidate area, the lateral wellbore is placed in the particular layer and at the particular azimuth direction, and the well completion type is utilized for the first well, the generating of the final score value being based on a combination of the first probability value, the second probability value, and the third probability value.

15. The method of claim 14, further comprising:
determining that the final score value is below a threshold value;
generating a recommendation to adjust a drilling operation based on the determining that the final score value is below the threshold value; and
causing display of the recommendation in a user interface of a client device.

16. The method of claim 11, further comprising:
training the BDN model, based on geological and geophysical data associated with the second, nearby well, to perform the first assessment, output the first probability value, perform the second assessment, output the second probability value, perform the third assessment, and output the third probability value.

17. The method of claim 16, further comprising:
training the BDN model to generate a final score value that indicates a potential level of production of the first well if the first well is drilled in the candidate area, the lateral wellbore is placed in the particular layer and at the particular azimuth direction, and the well completion type is utilized for the first well, the generating of the final score value being based on a combination of the first probability value, the second probability value, and the third probability value.

18. A non-transitory machine-readable storage medium comprising instructions that, when executed by one or more processors of a machine, cause the machine to perform operations comprising:

accessing, from a database, geological and geophysical data associated with a candidate area for drilling a first well and with an area of a second, nearby well;

performing, using a Bayesian Decision Network (BDN) model, a first assessment of a data availability score value, saturation data, fracture data, and seismic data included in the geological and geophysical data associated with the candidate area for drilling the first well;

outputting, based on the first assessment, a first probability value that indicates a potential level of production of the first well if drilled in the candidate area;

performing, using the BDN model, a second assessment of an offset data score value, stress data, thickness data, and porosity data included in the geological and geophysical data associated with the second, nearby well;

outputting, based on the second assessment, a second probability value that indicates a potential level of production of the first well if a lateral wellbore is placed in a particular layer and at a particular azimuth direction in a reservoir associated with the candidate area;

performing, using the BDN model, a third assessment of tortuosity data, washout data, porosity data, and a net-to-gross value associated with the first well; and outputting, based on the third assessment, a third probability value that indicates the well completion type for the first well.

19. The non-transitory machine-readable storage medium of claim 18, further comprising:
generating, based on the third probability value, a recommendation that references the well completion type for the first well; and
causing display of the recommendation in a user interface of a client device.

20. The non-transitory machine-readable storage medium of claim 18, further comprising:
generating a final score value that indicates a potential level of production of the first well if the first well is drilled in the candidate area, the lateral wellbore is placed in the particular layer and at the particular azimuth direction, and the well completion type is utilized for the first well, the generating of the final score value being based on a combination of the first probability value, the second probability value, and the third probability value.

* * * * *